(12) United States Patent
Campardo et al.

(10) Patent No.: US 10,706,924 B2
(45) Date of Patent: Jul. 7, 2020

(54) NON-VOLATILE MEMORY DEVICE, IN PARTICULAR PHASE CHANGE MEMORY, AND READING METHOD

(71) Applicant: STMicroelectronics S.r.l., Agrate Brianza (MB) (IT)

(72) Inventors: Giovanni Campardo, Bergamo (IT); Roberto Annunziata, Monza (IT); Paola Zuliani, Milan (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 0 days.

(21) Appl. No.: 16/393,115

(22) Filed: Apr. 24, 2019

(65) Prior Publication Data

US 2019/0341103 A1  Nov. 7, 2019

(30) Foreign Application Priority Data

May 4, 2018  (IT) .................. 102018000005084

(51) Int. Cl.
*G11C 11/00* (2006.01)
*G11C 13/00* (2006.01)

(52) U.S. Cl.
CPC ........ *G11C 13/004* (2013.01); *G11C 13/0004* (2013.01); *G11C 13/0026* (2013.01); *G11C 2013/0045* (2013.01); *G11C 2213/79* (2013.01)

(58) Field of Classification Search
CPC ............. G11C 13/004; G11C 13/0004; G11C 13/0026; G11C 13/0045

USPC ......................................................... 365/163
See application file for complete search history.

(56) References Cited

U.S. PATENT DOCUMENTS

| | | | |
|---|---|---|---|
| 2006/0262591 A1* | 11/2006 | Ambroggi | G11C 16/30 365/129 |
| 2010/0103726 A1 | 4/2010 | Bae et al. | |
| 2011/0051495 A1* | 3/2011 | Ito | G11C 5/147 365/148 |
| 2013/0155786 A1* | 6/2013 | Kim | G11C 7/02 365/189.07 |

FOREIGN PATENT DOCUMENTS

| | | |
|---|---|---|
| EP | 3217405 A1 | 9/2017 |
| KR | 100707305 B1 | 4/2007 |

* cited by examiner

*Primary Examiner* — Vu A Le
(74) *Attorney, Agent, or Firm* — Slater Matsil, LLP

(57) ABSTRACT

A non-volatile memory device has a circuit branch associated to a bit line connected to a memory cell. When the memory cell is read, in a precharging step, the bit line is precharged. In a characteristic shift step, the memory cell is activated, and a current source is activated to supply a shift current to the first bit line and cause the bit line to charge or discharge on the basis of the datum stored in the memory cell. In a detection step, the current source is deactivated, the memory cell is decoupled, and the bit line is coupled to an input of a comparator stage that compares the voltage on the bit line with a reference voltage to supply an output signal indicating a datum stored in the memory cell.

20 Claims, 6 Drawing Sheets

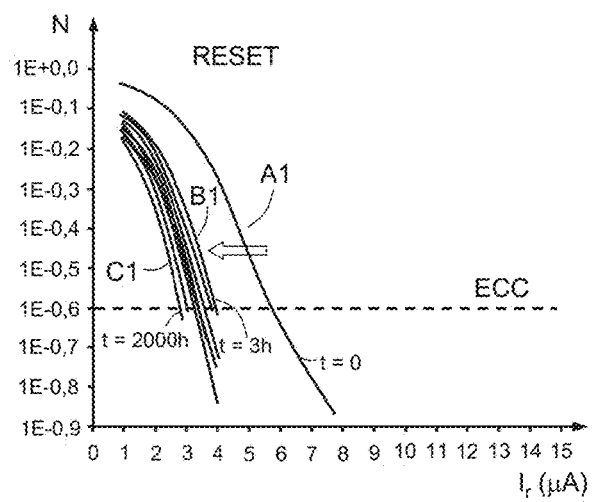
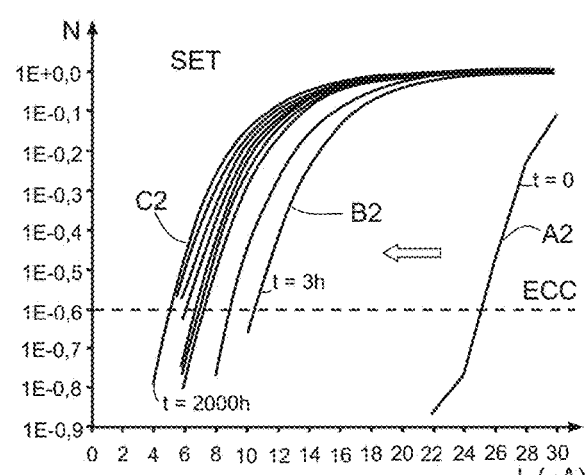
Fig.2A    Fig.2B
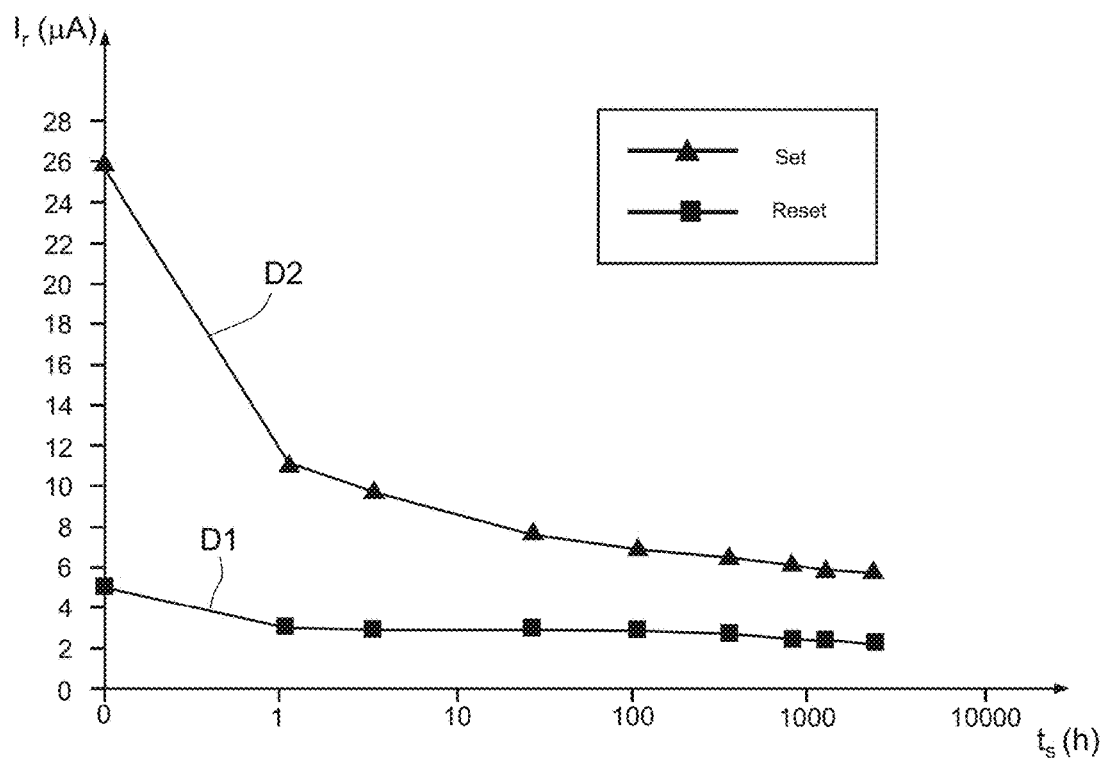
Fig.3

| | PRE-READING | PRE-CHARGING | EQUAL. | SHIFT | SHARING | READING |
|---|---|---|---|---|---|---|
| $VY0$ | 0 | →1 | 1 | 1 | →0 | 0 |
| $VY0'$ | 0 | 0 | 0 | 0 | 0 | 0 |
| $VYN$ | 0 | →1 | 1 | 1 | 1 | 1 |
| $VYN'$ | 0 | →1 | 1 | 1 | 1 | 1 |
| $V_{CA}$ | 0 | →1 | 1 | →0 | →1 | →0 |
| $V_{CA}'$ | 0 | 0 | 0 | 0 | 0 | 0 |
| $V_{CH}$ | 1 | →0 (ON) | →1 (OFF) | 1 (OFF) | 1 (OFF) | 1 |
| $V_{CH}'$ | 1 | 1 (OFF) | 1 (OFF) | 1 (OFF) | 1 (OFF) | 1 |
| ATD | 0 | 0 | →1 | →0 | 0 | 0 |
| EN | 0 | 0 | 0 | →1 | →0 | 0 |
| $V_R$ | 0 | 0 | 0 | increases | 1 | 1 |

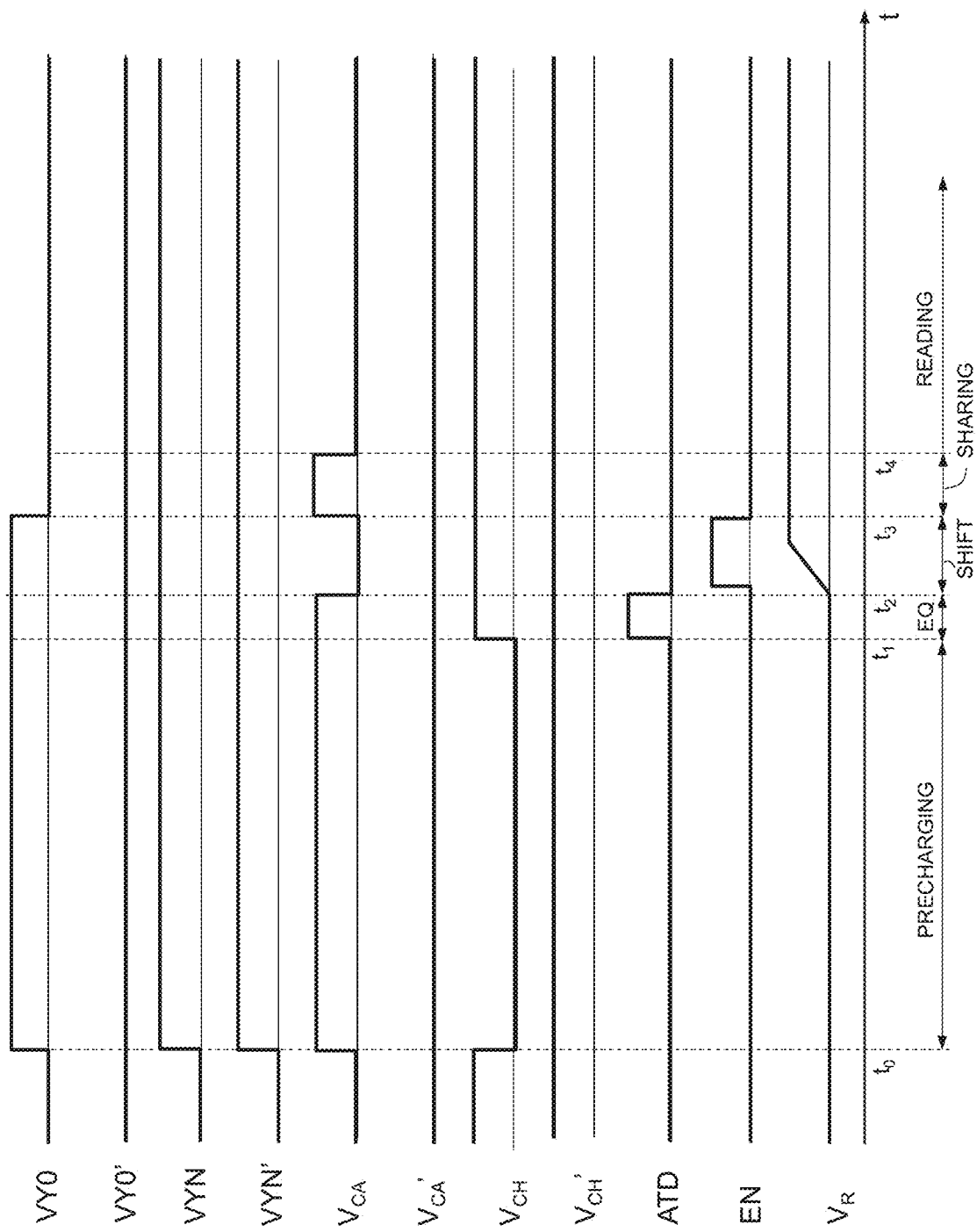

NON-VOLATILE MEMORY DEVICE, IN PARTICULAR PHASE CHANGE MEMORY, AND READING METHOD

CROSS-REFERENCE TO RELATED APPLICATIONS

This application claims the benefit of Italian Application No. 102018000005084, filed on May 4, 2018, which application is hereby incorporated herein by reference.

TECHNICAL FIELD

The present invention relates to a non-volatile memory device, in particular a phase change memory device, and to the reading method thereof.

BACKGROUND

As is known, and as illustrated schematically in FIG. 1, a non-volatile memory device, designated by 1, here of a phase change type, in general comprises a memory array 2 including a plurality of memory cells 3 arranged in rows and columns and storing respective data.

Each memory cell 3 is here formed by a storage element 4 of a phase change type, designed to store a binary datum, and by a selection element 5, here formed by an NMOS transistor, in series to the storage element 4. The selection elements 5 for memory cells 3 arranged in a same row have gate terminals coupled together and to a respective word line WL0, WL1, . . . . The selection elements 5 of memory cells 3 arranged in a same column have respective first conduction terminals coupled together and to a respective local bit line LBL1, . . . , LBLn, . . . . Each selection element 5 moreover has a second conduction terminal, coupled to a reference-potential line (for example, connected to ground).

The local bit lines LBL0, . . . , LBLi, . . . are coupled to a column decoding stage 6, illustrated in a simplified way, in turn coupled to a biasing and reading circuit 7, only a sense amplifier stage 12 thereof is illustrated. The word lines WL0, WL1, . . . are coupled to a row-decoding stage 8 illustrated schematically in FIG. 1. In a known way, the biasing and reading circuit 7, the column decoding stage 6, and the row-decoding stage 8 allow selection of one or more memory cells 3 each time on the basis of address signals generated by a control unit 10 (also represented schematically).

In the example illustrated, the memory 1 has a hierarchical bit line structure (in the simplified example, with two levels, but three levels could be envisaged), where the local bit lines LBL1, . . . , LBLi, . . . are coupled, through first switches 13.0, 13.1, . . . , to global bit lines (also referred to as "main bit lines") MBL0, MBL1, . . . , which are, in turn, coupled to the biasing and reading circuit 7 through second switches 14.0, 14.1, . . . . In the schematic representation of FIG. 1, the first switches 13.0, 13.1, . . . , the second switches 14.0, 14.1, . . . , and the global bit lines MBL0, MBL1, . . . form the column decoding stage 6. In some embodiments, as referred to above, the column decoding stage 6 may comprise a further hierarchical level, with further bit lines and corresponding third switches, in a way known to the person skilled in the art and not illustrated.

The biasing and reading circuit 6 forms in particular one or more reading paths, which may be activated individually or in parallel, and each whereof is designed to create a conductive path between the memory cells 3 of the memory array 2 each time selected and the sense amplifier stage 12. The latter is of a differential type and is intended to compare the current circulating in the selected memory cell 3 with a reference current in order to determine the value of the datum stored and generate a corresponding digital reading signal.

Recently, the use of memory devices produced in the back-end steps of the process, the storage element whereof is provided in the last layers of the device, has assumed greater importance due to the possibility of simplifying the manufacturing process and consequently reducing the manufacturing costs, affording memory devices of an embedded type, possibly integrated in a same die with other circuits and obtained in an advanced CMOS technology.

In particular, back-end integration of non-volatile phase change memory devices becomes increasingly important. In these memory devices, the storage element is formed by a region of a material that, when subjected to adequate current values, is able to change its own physical structure, passing from an amorphous phase to a crystalline phase and vice versa, with consequent variation of its ohmic resistance. This variation of ohmic resistance is used for storing digital data.

The two states of the storage element are known as:

the SET state, associated to the crystalline phase characterized by a lower resistance, and thus, in case of constant-voltage reading of the storage element, by a higher current; and the RESET state, associated to the amorphous phase characterized by a higher resistance, and thus, in case of constant-voltage reading of the storage element, by a lower current.

In this type of memory, phase transition in the storage element is activated in temperature and is obtained by applying a current pulse having a duration of a few microseconds, which, by the Joule effect, locally raises the temperature and modifies the physical structure of the material.

This type of memory device is thus potentially sensitive to problems of data retention, which emerge in particular when the device is exposed to intermediate temperatures, even not very high ones (up to 165° C.), but for long times (up to a few thousand hours). This frequently occurs, for example, when the memory device is used for automotive applications and thus normally functions at temperatures of 150-160° C.

In particular, in this situation, the phenomena that may arise and may lead to failure or in any case to incorrect operation, are linked to the loss of the amorphous and crystalline states (associated to the conditions of reset and set), due to partial crystallization, i.e., to passage to a less orderly crystalline condition of the material that is in the amorphous or crystalline phase.

For applications where the temperature plays a fundamental role, the type of material chosen, and in particular its composition, may be optimised so as to meet requirements of reliability and retention of the data.

However, also in this case, application of intermediate temperatures may lead to a non-negligible phase variation of the optimised material, leading to a progressive reduction of the difference between the values of current, or resistance, associated to the two states of the memory.

The phenomenon may be highlighted considering the normalised distribution of the number N of cells as a function of the reading current $I_r$ and following evolution thereof in time at constant temperature, as illustrated in FIG. 2A in case of memory cells programmed in the reset state and in FIG. 2B in case of memory cells programmed in the set state and kept at a constant temperature of 150° C. from the programming instant in the reset and set state ($t_s$=0).

In particular, in these figures, the curves A1 and A2 represent the cumulative distributions of the reset and set cells, respectively, that conduct reading currents up to the values $I_r$ reported at time zero, and the other curves represent similar cumulative distributions of memory cells conducting reading currents up to the values $I_r$, plotted after progressively increasing times from programming (as indicated by the arrows), from 3 h (curves B1 and B2, respectively) up to 2000 h (curves C1 and C2, respectively).

As may be noted, both the distribution of the reset cells and the distribution of the set cells shift, with increasing time elapsed since programming thereof, towards the left, i.e., towards lower current values. This phenomenon is particularly important in case of the set cells (FIG. 2B), which shift from values of the reading current comprised between 22 µA and 30 µA, to much lower current values, as little as 5 µA, after 2000 h.

The worst cells of the distributions, defined as the ones that cannot be recovered by the error-correction reading scheme, can be identified at the intersection between the distributions and the equiprobability straight line ECC (set at $10^{-6}$ in the example of FIGS. 2A and 2B).

This means that, without reprogram or refresh, the difference of reading current between the worst cells that have been set long before reading thereof (and have, for example, reading currents of a few milliamps) and the worst cells that have been reset recently is very low or even zero.

This fact is highlighted by the curves D1 and D2 of FIG. 3, which present the data of FIGS. 2A and 2B as a function of the storage time $t_s$ (at a fixed temperature) for the worst cells in the distributions of reset and set cells, kept at 150° C. after programming thereof at $t_s$=0, up to a time of approximately 1000 h. The distance between the two curves D1 and D2 thus represents the reading window for the memory.

In particular, FIG. 3 shows that, for $t_s$=0, the difference between the reading currents of the worst set cells and of the worst reset cells is high and that this difference tends to decrease in time due to the temperature applied.

FIG. 4 presents at an enlarged scale a portion of FIG. 3, where the arrows indicate the differences of reading currents $I_r$ at different storage times $t_s$, and shows a grey area representing a "free" range of reading currents $I_r$, i.e., one without set or reset cells.

The above range represents a working window of approximately 1 µA, which is clearly set apart from the curves D1 and D2 for low values of storage time $t_s$, but then approaches the curve D2 of the worst set cells and reaches it for a storage time a little higher than 1000 h. After this time, in case of fast reading, i.e., of a few nanoseconds, the working window overlaps the curve D2 of the worst set cells and thus does not enable reading with a sufficiently low error margin. With this working window it is thus necessary to re-program the cells via a refresh operation after a maximum time of 1000 h.

Also in this way, reading of the cells would be problematical. In fact, in memories of a NOR flash type, reading is in general carried out by comparing the reading current $I_r$ with a reference current, generated by a reference cell formed in the same memory array so as to have the same electrical characteristics or generated by an equivalent current source.

In theory, the reference current could be variable in time, as a function of the programming time, or constant.

However, in case of a reference current that is variable in time, it would be necessary to trace the time that has elapsed since programming of the cell to be read and adapt the characteristics of the reference element to be in the middle of the working window of FIG. 4. This solution is not, however, practicable, since tracing the programming time of each cell would be complex and entail high costs and unacceptable reading times.

On the other hand, reading via a fixed reference proves complex at high reading speeds (current requirements call, for example, for a reading time of approximately 10 ns). In fact, for instance, a same memory array could comprise a cell that has been set for almost 1000 h and has a reading current a little higher than 6 µA and a cell that has just been reset, with a reading current a little lower than 5 µA. The reference current could thus be set half-way between these values, for example at 5.5 µA. In this case, the reading circuit could be designed so as to be able to distinguish a reading current of 5 µA with respect to a reference at 5.5 µA or a reading current of 6 µA with respect to the same reference at 5.5 µA.

In practice, this entails being able to distinguish currents that differ by 0.5 µA, which is already difficult in itself at the considered reading rates. In addition, the above resolution is a fraction of the read currents, both for the set cells and for the reset cells, whereby the problem is more complex and some fast reading solutions used for other types of memory are inapplicable.

For instance, in Italian patent application 102016000024496 filed in the name of the present applicant (corresponding to the U.S. Pat. No. 9,865,356 and to European patent application EP 3 217 405) a reading method and circuit are described wherein the voltage across the selected bit line is compared with the voltage across an adjacent bit line pre-charged at an intermediate value between the values that can be reached by the selected bit line in the two states stored by the memory cell to be read. In particular, the reading method disclosed in this patent application, described with reference to floating-gate flash cells, exploits the parasitic capacitances existing in the memory array and consists in charging two global bit lines (that of the cell to be read and that of an adjacent bit line) at the intermediate value. Then, the cell to be read is read. If this cell stores a bit "1", it conducts current and causes discharging of its own local bit line and thus, by charge sharing, of its own global bit line, bringing the latter to a lower voltage value than the intermediate value on the adjacent global bit line. If the cell to be read stores a bit "0" and thus does not conduct current, its local bit line does not discharge, but brings its own global bit line to a higher voltage value than the intermediate value on the adjacent global bit line.

The reading circuit described in the above Italian patent application 102016000024496 operates very well when one of the two programming states is characterized by a zero current, as occurs, for example, for the mentioned application of floating-gate flash cells, but is not usable when a common current contribution is present, as in case of a memory cells of a PCM type having the electrical behaviour discussed above.

The aim of the present invention is to provide a reading circuit and method that overcome the limitations of the prior art.

SUMMARY

According to an embodiment of the present invention, a phase change, non-volatile memory device and a corresponding reading method are provided, as defined in the attached claims.

According to an embodiment of the present invention, the non-volatile memory device has a circuit branch associated to a bit line connected to a memory cell to be read. While reading the memory cell, in a precharging step, the bit line is pre-charged. In a characteristic shift step, the memory cell is activated, and a current source is activated to supply the bit line with a shift current and cause charging or discharging of this bit line on the basis of the datum stored in the memory cell. In a detection step, the current source is deactivated, the memory cell is decoupled, and the bit line is coupled to an input of a comparator stage, which compares the voltage on the bit line with a reference voltage to supply an output signal indicating the datum stored in the memory cell. The shift current is chosen so as to be higher than the current of the memory cell when the latter is in a first programming state, and less than the current of the memory cell when latter is in a second programming state.

BRIEF DESCRIPTION OF THE DRAWINGS

For a better understanding of the present invention, some embodiments thereof are now described, purely by way of non-limiting example, with reference to the attached drawings, wherein:

FIGS. 2A and 2B show normalized cumulative distributions of the number of memory cells of the device of FIG. 1, as a function of the reading current, for reset and set cells, respectively;

FIG. 3 shows the plot of the reading currents for the worst cells in the reset and set states, as a function of the time elapsed since programming;

FIG. 9 shows the plot of electrical quantities in the circuit of FIG. 7.

DETAILED DESCRIPTION OF ILLUSTRATIVE EMBODIMENTS

Figure 4:
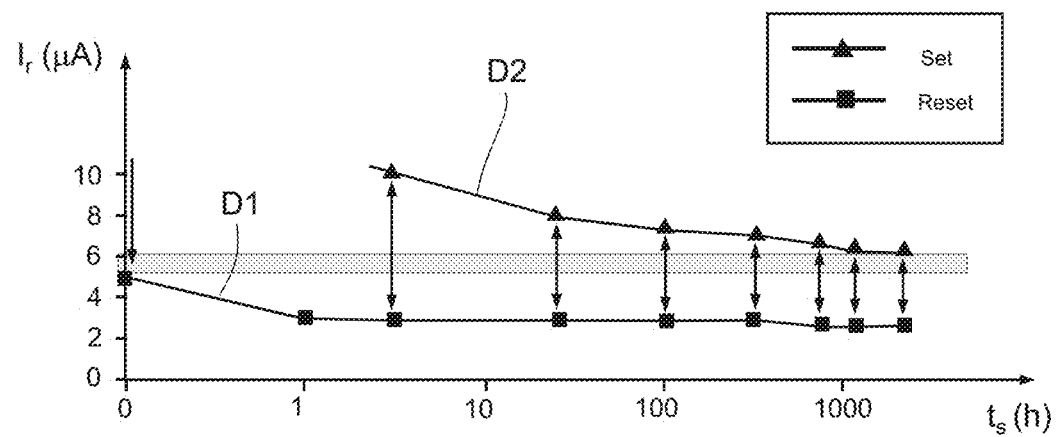
FIG. 4 shows at an enlarged scale a portion of the curves of FIG. 3.
Figure 5:
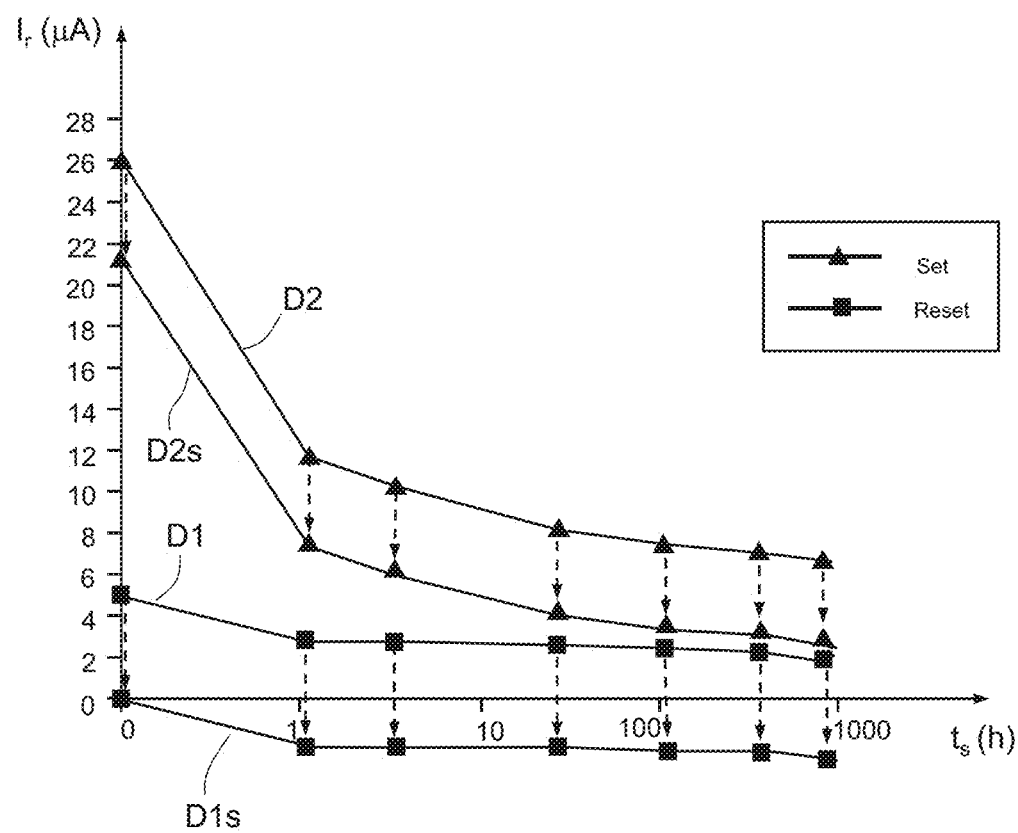
FIG. 5 shows the curves of FIG. 4 translated by adding a constant current to a memory cell to be read, according to one aspect of the present invention.

The present reading method is based upon translating the curves of FIG. 4 downwards so that the distribution at lower reading current (that of the worst reset cells) goes to a theoretically negative current. This is illustrated in FIG. 5, where the arrows indicate the displacement of the reading currents of the worst set and reset cells, and the translated curves are designated by D1s and D2s. In fact, since it is not possible to have negative currents, the reset memory cells come to have a zero reading current, thus facilitating their discrimination from the set memory cells.

In practice, by appropriately choosing the shift current value (in the case illustrated, of 5 µA), the worst set cells (after 1000 h) have a current of 1 µA and the reset cells have again a zero current, so that the reading margin becomes 1 µA; in addition, advantageously, the reading margin is referenced to zero.

Moreover, to improve the reading performance, increasing the reading rate, and at the same time reducing the size of the memory device, the principle forming the subject of the aforementioned Italian patent application 102016000024496 is exploited, comprising a further step of injecting a characteristics shift current for the programmed memory cells, thereby discharging/charging the corresponding bit lines, before charge sharing (here between the global bit line and an output capacitance) and unbalancing the bit lines connected to a sense amplifier.

The effect of the reading current shift mentioned above may be obtained as illustrated in FIG. 6.

Figure 1:
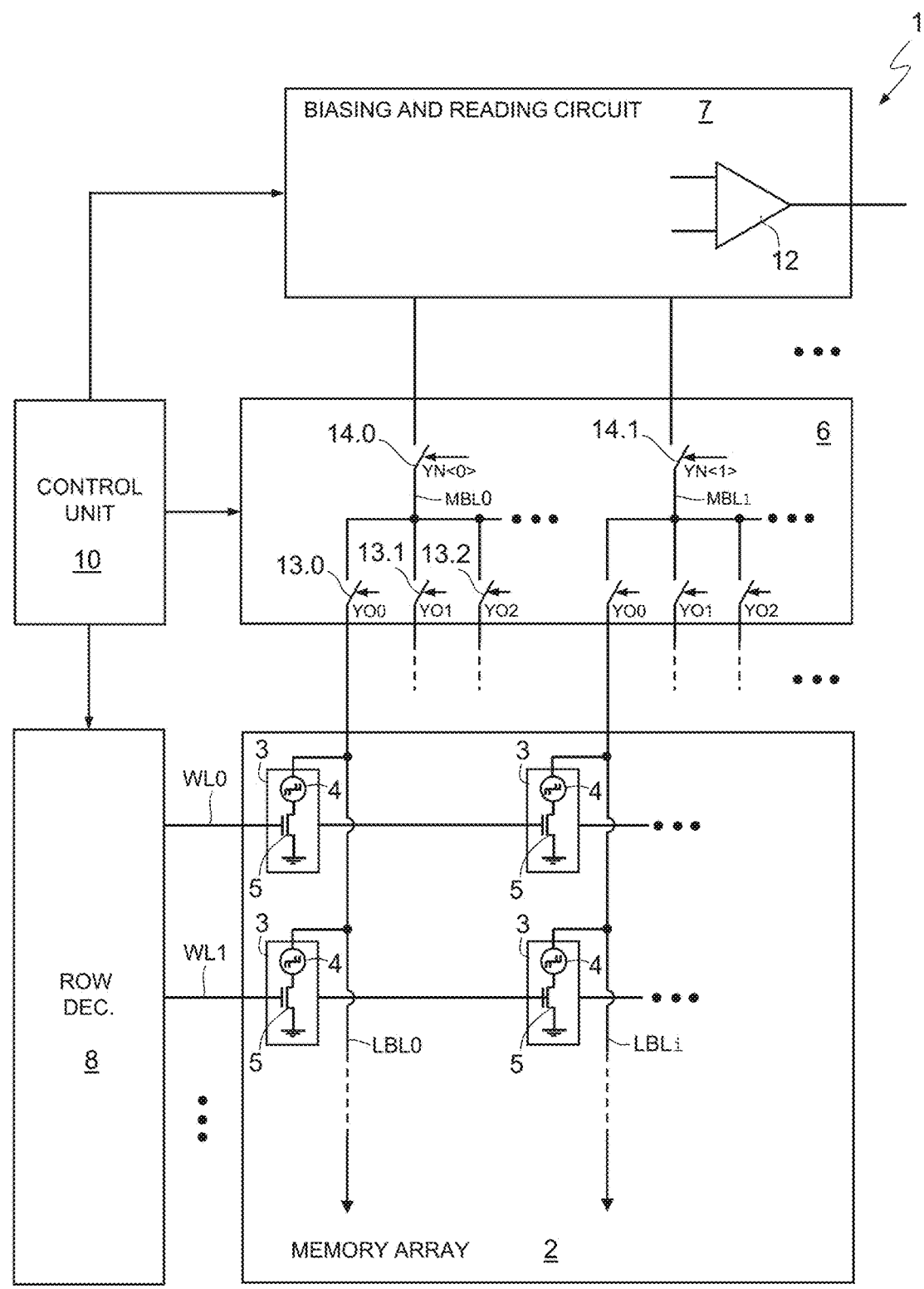
FIG. 1 is a schematic illustration of the structure of a non-volatile memory device of the considered type.
Figure 6:
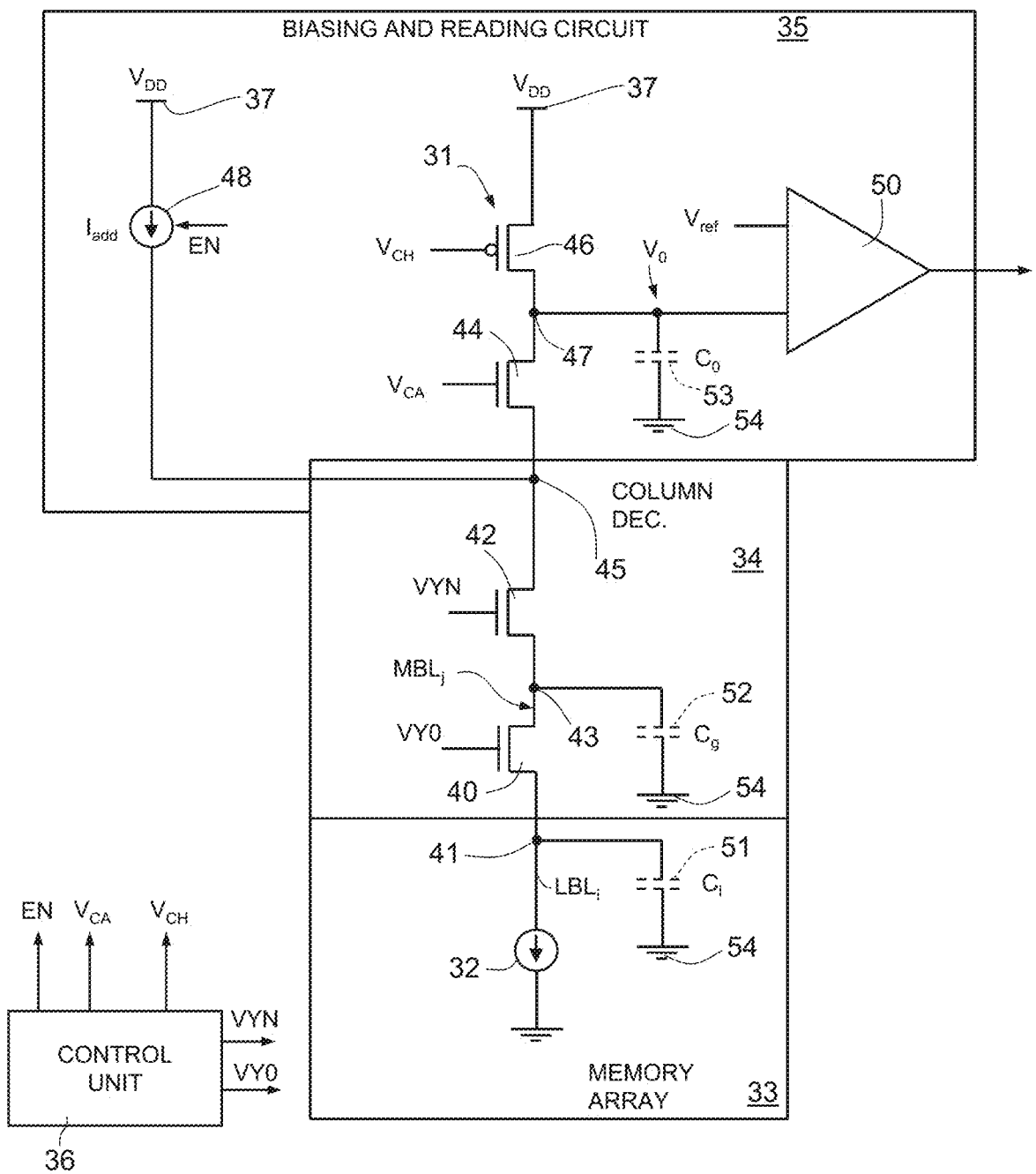
FIG. 6 shows a simplified circuit diagram of the present memory device.

FIG. 6 shows a portion of a memory device 30 having a general structure similar to FIG. 1 and thus comprising a memory array 33 arranged in rows and columns, a column decoder 34, and a biasing and reading circuit 35, similar to the corresponding stages 2, 6, and 7 of FIG. 1. In particular, in FIG. 6, of blocks 33-35 are shown the elements arranged in a reading branch 31 connected to a memory cell to be read 32 and useful for an understanding of the present reading method.

Specifically, the reading branch 31 comprises a local decoding transistor 40, a global decoding transistor 42, an output connection transistor 44, and a charge transistor 46, coupled in series to each other and between a local bit line $LBL_i$ (physically coupled to the memory cell to be read 32) and a supply line 37.

In detail, the local decoding transistor 40, here of an NMOS type and belonging to the column decoding stage 34, has a first conduction terminal, connected to a local node 41 coupled to the local bit line $LBL_i$, a second conduction terminal, connected to a global node 43 coupled to a global bit line $MBL_j$, and a control terminal receiving a local decoding signal VY0 from a control unit 36, similar to the control unit 21 of FIG. 1.

The global decoding transistor 42, here also of an NMOS type and belonging to the column decoding stage 34, has a first conduction terminal coupled to the global node 43, a second conduction terminal connected to an internal node 45, and a control terminal receiving a global decoding signal VYN by the control unit 36.

The output connection transistor 44, here also of an NMOS type, has a first conduction terminal connected to the internal node 45, a second conduction terminal connected to an output node 47, and a control terminal receiving a biasing signal $V_{CA}$ from the control unit 36. The output node 47, at an output voltage $V_O$, is further coupled to a first input of a sense amplifier 50, of a differential type, having a second input receiving a reference voltage $V_{ref}$.

The charging transistor 46, here of a PMOS type, has a first conduction terminal connected to the output node 47, a second conduction terminal connected to the supply line 37, which receives a supply voltage $V_{DD}$, and a control terminal that receives a precharging signal $V_{CH}$.

A current source 48 is moreover coupled to the internal node 45 and generates, when enabled by a source enable signal EN generated by the control unit 36, a shift current $I_{add}$ that is injected into the internal node 45.

FIG. 6 also shows capacitances present in the reading branch 31.

In particular, a local parasitic capacitor 51 (illustrated by a dashed line and having a local capacitance $C_l$) is coupled between the local node 41, associated to the local bit line $LBL_i$, and a reference potential line 54 (here ground) of the memory device 30. A global parasitic capacitor 52 (also illustrated by a dashed line and having capacitances $C_g$) is coupled between the global node 43, associated to the global bit line $MBL_j$, and the reference potential line 54. An output capacitor 53 (here of a parasitic type and thus illustrated by a dashed line, but which may comprise a physical component, and has a capacitance $C_O$) is coupled between the output node 47 and reference potential line 54.

In general, the capacitance $C_g$ of the global parasitic capacitor 52, i.e., the parasitic capacitance associated to the global bit line $MBL_j$, is higher than a local capacitance $C_l$ of the local parasitic capacitor 51, i.e., the parasitic capacitance associated to the local bit line $LBL_i$, as well as than the capacitance $C_O$ of the output capacitor 53 on the output node 47.

In the reading branch 31, the shift current $I_{add}$ has the value of the maximum reading current of a worst reset cell. For instance, with reference to the values illustrated in FIGS. 2A, 2B, 3-5, the shift current $I_{add}$ is 5 µA.

In this condition, if the memory cell to be read 32 is programmed in the RESET state and thus draws a current lower than or at the most equal to 5 µA (reading value of the worst reset cell), the shift current $I_{add}$ compensates the current drawn by this memory cell and consequently, to a first approximation, does not modify the voltage at the nodes of the reading branch 31.

Instead, if the memory cell to be read 32 is programmed in the SET state and thus draws a higher current than the shift current $I_{add}$, the difference between the current of the cell to be read 32 and the shift current $I_{add}$ is supplied by the reading branch 31, thus causing a reduction of the voltage on the global node 43 and on the internal node 45, as well as on the output node 47. This voltage reduction can be detected by the sense amplifier 50, with an appropriately fixed value of the reference voltage $V_{ref}$.

In this way, with a memory cell to be read 32 in the reset state, the current supplied by the reading branch 31 is zero, and the sense amplifier 50 outputs a logic "0", whereas, with a memory cell to be read 32 in the set state, the current supplied by the reading branch 31 is higher than zero, and the sense amplifier 50 outputs a logic "1".

As mentioned previously, the principle set forth above with reference to FIG. 6 may be applied to the reading circuit and reading method described in the aforementioned Italian patent application 102016000024496 to obtain the described advantages of reading speeds and memory size reduction.

Figures 7, 8:
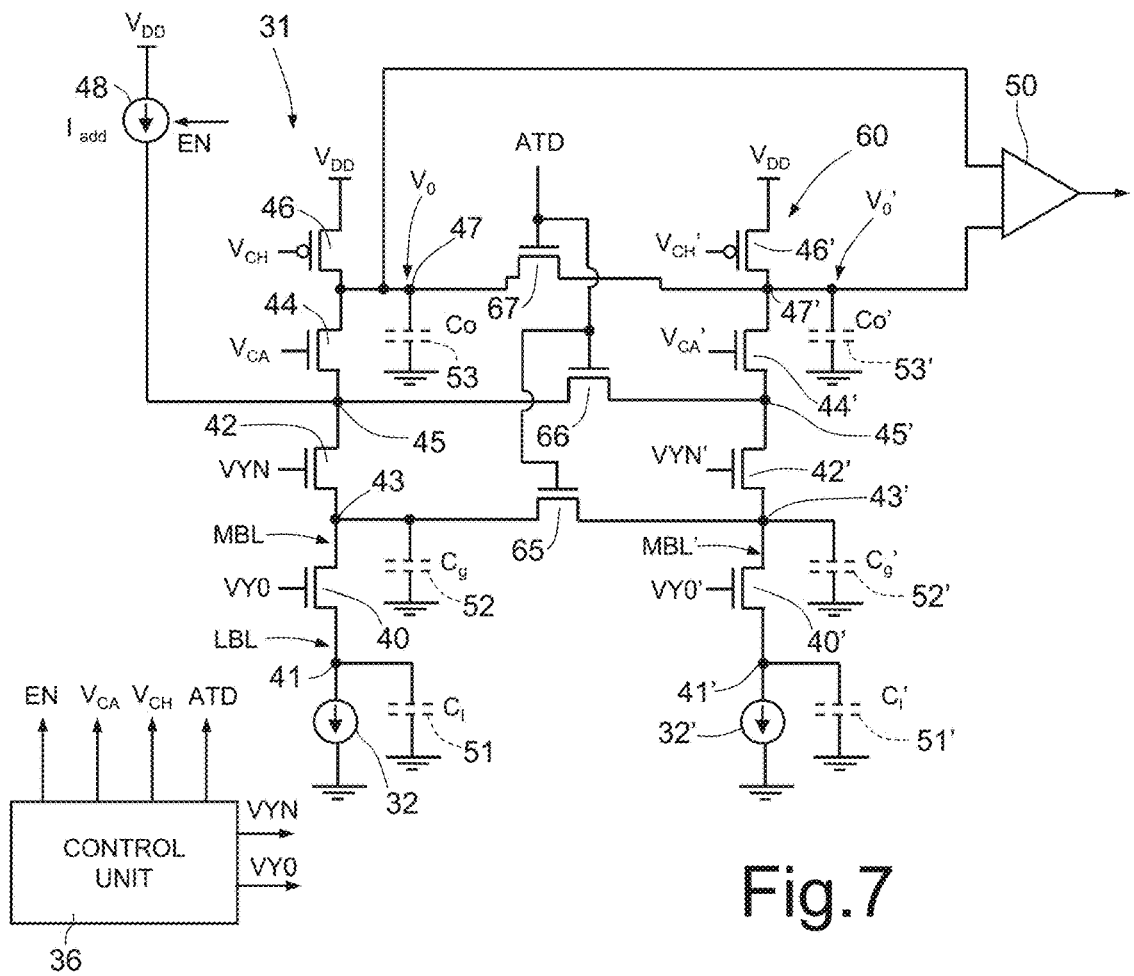
FIG. 7 shows a more complete circuit diagram of the present memory device.
FIG. 8 shows a table regarding the steps of the present reading method.

FIG. 7 shows an implementation of the memory device 30 that employs the above principle.

In detail, FIG. 7 shows a reference branch 60, which, as described in the aforementioned Italian patent application 102016000024496, comprises a global bit line adjacent to the global bit line $MBL_j$, for example the global bit line $MBL_{j+1}$, referred to hereinafter for simplicity as MBL'. For simplicity, hereinafter the global bit line $MBL_j$ coupled to the memory cell to be read will be designated by MBL and the local bit line $LBL_i$ will be designated by LBL.

The reference branch 60 has a structure similar to the reading branch 31 and thus its elements will not be described in detail and are designated hereinafter and represented in FIG. 7 by the same numbers as the corresponding elements of the reading branch 31, provided with prime signs.

FIG. 7 moreover shows equalization elements of the reading branch 31 and of the reference branch 60.

In detail, the memory device 30 has first, second, and third equalization transistors 65, 66, 67. Here, the first equalization transistor 65, of an NMOS type, is connected between the global nodes 43 and 43' of the reading branch 31 and of the reference branch 60, respectively, and has a control terminal receiving an equalization signal ATD generated by the control unit 36. The second equalization transistor 66, here also of an NMOS type, is connected between the internal nodes 45 and 45' of the reading branch 31 and of the reference branch 60, respectively, and has a control terminal receiving the equalization signal ATD. The third equalization transistor 66, here also of an NMOS type, is connected between the output nodes 47 and 47' of the reading branch 31 and of the reference branch 60, respectively, and has a control terminal receiving the equalization signal ATD.

As discussed in detail hereinafter, the equalization transistors 65-67 have the function of equalizing the nodes connected to them so that they have, in some read operating steps, substantially the same voltage values.

Reading of the memory device 30 of FIG. 7 comprises four different steps (precharging, equalization, characteristic shifting, and sharing), described hereinafter in detail with reference to FIGS. 8 and 9, showing, a table presenting the values of the control signals in the circuit of FIG. 7 in the different reading steps and, respectively, the timing charts of the control signals and the voltage on the word line (corresponding to the word line WL of FIG. 1) connected to the memory cell to be read 32 (row voltage $V_R$). The row voltage $V_R$ is applied also to the reference cell 32', even though this cell is kept off in all the steps of reading of the cell to be read 32 and does not participate in reading, as explained in detail hereinafter.

In a precharging step, the reading branch 31 is precharged, and the reference branch 60 is floating. To this end, at time $t=t_0$, the local decoding signal VY0 supplied to the reading branch 31 switches to the high state, connecting the memory cell to be read 32 to the respective global bit line MBL, whereas the local decoding signal VY0' supplied to the reference branch 60 is kept low and keeps the reference memory cell 32' disconnected from the respective global bit line MBL' (this disconnection continues also in the subsequent steps). The global decoding signals VYN and VYN' switch to the high state, connecting the global bit lines MBL and MBL' to the respective internal nodes 45 and 45'. In the reading branch 31, the biasing signal $V_{CA}$ switches to the high state, and the precharging signal $V_{CH}$ switches to the low state, turning on the output connection transistor 44 and the charging transistor 46. In the reference branch 60, the biasing signal $V_{CA}'$ remains in the low state, and the charging signal $V_{CH}'$ remains in the high state, keeping the output connection transistor 44' and the charging transistor 46' of the branch 60 off. Moreover, the equalization signal ATD and the source enable signal EN remain low, keeping the equalization transistors 65-67 and the current source 48 off.

In this situation, the reference branch 60 is decoupled from the rest of the circuit; the reading branch 31 is connected to the supply voltage $V_{DD}$, thus causing charging of the parasitic capacitances $C_l$, $C_g$, and $C_O$; the internal node 45, the global node 43, and the local node 41 thus all charge to approximately a same preset voltage value $V_P = V_{dd} - V_b$, where $V_b$ corresponds to the high value of the biasing signal $V_{CA}$.

The memory cell to be read 32 is off, since the respective word line (not illustrated) is still low, as illustrated by the row voltage $V_R$. As mentioned, also the reference memory cell 32' is off.

In an equalization step, the reading branch 31 and reference branch 60 are equalized. To this end, at time $t=t_1$, the precharging signal $V_{CH}$ switches to the high state, turning off the charging transistor 46 and disconnecting the reading branch 31 from the supply voltage VDD. Moreover, the equalization signal ATD switches to the high state. The other signals remain in the previous state, and the row voltage $V_R$ remains low.

In this condition, the equalization transistors 65-67 turn on and connect the internal node 45, the global node 43, and the local node 41 of the reading branch 31 to the corresponding nodes 45', 43', and 41' of the reference branch 60. These nodes on the reading branch 31 and on the reference branch 360 thus all go to approximately the same voltage, which is slightly lower than the preset voltage value $V_P$, since the local bit line LBL' of the reference branch 60 remains always disconnected from the reference cell 32' and thus the global capacitance of the reference branch 60 is lower than the global capacitance of the reading branch 31.

In a characteristic shift (discharging/charging) step, the output node 47 (and thus the output capacitor 53) are decoupled from the global bit line MBL, and the internal node 45 discharges or charges, according to the state of the memory cell 32 to be read, and the shift current $I_{add}$ is supplied.

To this end, at time $t=t_2$, the biasing signal $V_{CA}$ is switched to the low state, isolating the output node 47 from the rest of the reading branch 31, and the equalization signal ATD switches to the low state, turning the equalization transistors 65-67 off and thus disconnecting the reading branch 31 from the reference branch 60. Thus, the reference branch 60 remains at the previous voltage levels, whereas the reading branch 31 is free to evolve.

After a short delay, the source enable signal EN is switched to the high state, turning the current source 48 on; the latter thus starts supplying current.

In this step, the word line connected to the memory cell to be read 32 starts to rise, as shown in FIG. 9 by the row voltage VR. The memory cell to be read 32 thus switches into the reading condition, and the voltage on the internal node 45 goes to a value represented by the ratio between the current drawn from the memory cell to be read 32 and the shift current $I_{add}$ supplied by the source 48. In particular:

if the current drawn from the memory cell to be read 32 is higher than the shift current $I_{add}$ supplied by the source 48 (memory cell to be read 32 in the set state, corresponding to storage of a logic "1"), the parasitic capacitors 51 and 52 associated to the local node 41 and to the global node 43 are discharged, thus causing the voltage thereon and thus on the internal node 45 to reduce;

if the current drawn from the memory cell to be read 32 is lower than the shift current $I_{add}$ supplied by the source 48 (memory cell to be read 32 in the reset state, corresponding to storage of a logic "0"), the excess current supplied by the source 48 charges the parasitic capacitances 51 and 52, and the global node 43 and the internal node 45 raise to a higher voltage value; this behaviour corresponds to a downward characteristic shift of the memory cell to be read 32 by an amount equal to $I_{add}$, as shown in FIG. 5.

A sharing step enables the voltage on the internal node 45 to be amplified and supplied to the output node 47, and includes de-activation (disconnection) of the shift current $I_{add}$ and recoupling of the output node 47 to the global bit line.

To this end, at time instant $t=t_3$, the local decoding signal VY0 supplied to the reading branch 31 switches to the low state, disconnecting the memory cell to be read 32 from the respective global bit line MBL, the source enable signal EN switches to the low state, turning the current source 48 off, and the biasing signal $V_{CA}$ is switched once again to the high state, turning the output connection transistor 44 on and causing connection of the internal node 45 to the output node 47 of the reading branch.

In this step, charge is shared between the global parasitic capacitor 52 and the output capacitor 53, the outcome whereof depends upon the charge state of the global parasitic capacitor 52, i.e., upon whether the memory cell to be read 32 is in the set or reset state.

In particular, sharing is similar to the one described in the above Italian patent application 102016000024496 between the local parasitic capacitor (designated therein by 51) and the global parasitic capacitor (designated therein by 52), and there described in detail on the basis of the ratio between the capacitance values on the global node and on the local node.

In this connection, with reference once again to FIG. 7, it is recalled that, as a result of equalization, the output voltages $V_0$ and $V_0'$ at the output nodes 47 and 47' at time instant $t=t_3$ are equal to each other and to Vref.

The output voltage $V_0'$=Vref at the output node 47' of the reference branch 60 remains constant during the sharing step, since the output node 47' is isolated from the rest of the circuit (transistors 46', 67 and 44' off).

Instead, the output voltage $V_0$ at the output node 47 of the reading branch 31 varies.

In particular, if the memory cell to be read 32 was set (state stored: logic "1") and has caused discharge of the global parasitic capacitor 52 and reduction of the voltage at the internal node 45, equal to $-\Delta V_{45}$, charge sharing between the global parasitic capacitor 52 and the output capacitor 53 causes a reduction of the output voltage $V_0$ present on the output node 47.

Instead, if the memory cell to be read 32 was reset (state stored: logic "0") and has caused charging of the global capacitor 52 and an increase in the voltage at the internal node 45, equal to $\Delta V_{45}$, charge sharing between the global parasitic capacitor 52 and the output capacitor 53 causes an increase of the output voltage $V_0$ at the output node 47.

In practice, at the end of the sharing step and if $I_r$ is the current drawn from the memory cell to be read 32, $V_{0d}$=Vref is the voltage at the output node 47 at the end of the characteristic shift (equal to the equalization value), $V_{0s}$ is the voltage value at the output node 47 at the end of sharing, and by setting $\Delta V_0 = V_{0s} - V_{0d}$, we obtain:

if $I_r < I_{add} \rightarrow V_{0s} > V_{0d}$, then $V_{0s} >$ Vref if $I_r > I_{add} \rightarrow V_{0s} < V_{0d}$, then $V_{0s} <$ Vref and $-\Delta V_0 = \Delta V_{45} * (C_g/C_0)$ where $C_g$ and $C_0$ are, respectively, the capacitance of the global parasitic capacitor 52, associated to the global bit line MBL, and the capacitance of the output capacitor 53, coupled to the output node 47, and $\Delta V_{45}$ is the voltage variation on the node 45 in the characteristic shift step.

An evaluation step is now described. At the end of sharing, time instant $t_4$, the biasing signal $V_{CA}$ is switched once again to the low state, turning the output connection transistor 44 off and causing disconnection of the internal node 45 from the output node 47 of the reading branch 31, thus freezing the voltage at the output node 47.

The sense amplifier 50 may thus compare the voltage $V_0$ at output node 47 with the reference voltage Vref to determine whether the datum read is a logic "0" or "1".

Indeed, during actual operation, there are effects that modify in part the above, without this, however, having any repercussion on the operating principle.

In fact, for the threshold current of the memory cell to be read 32 (at which the voltage value on the output node 47 and the internal node 45 reverses) to be equal to the current $I_{add}$ supplied by the current source 48, the value of the voltage at the internal node 45 and thus at all the global bit lines MBL, should remain constant also during characteristic shift, which obviously does not occur on account of turning-on of the memory cell to be read 32 and of the current source 48. In fact, during the characteristic shift step, due to turning-on thereof, the value of the voltage at the internal node 45 shifts and causes also the local parasitic capacitor 51 and global parasitic capacitor 52 to participate in the dynamics of the characteristic shift step. In practice, if during the characteristic shift step the voltage of the internal node 45 shifts by a few millivolts with respect to the equalization value, since this node associated to resistances in the region of a few KΩ (on account of parasitic resistances of the various components, including the local decoding and global decoding transistors 40, 42), current variations of the order of milliamps, i.e., of the same order of magnitude as the currents to be evaluated, may occur. To solve this problem it is, however, sufficient, during calibration of the memory device 30, to determine the current value $I_{add}$ such as to compensate this effect, and the effective displacement of the distributions D1, D2 of FIG. 3 will occur at a higher current of the memory cell than the theoretical one, allowing in any case the output node 47 to be kept at the same voltage as the reference node 47' at the end of the characteristic shift step, before sharing.

Likewise, during calibration it is possible to compensate further effects due to leakage currents in the real circuit.

The advantages of the memory device and the reading method described herein are evident from the foregoing.

In particular, by virtue of the proposed solution, it is possible to read in a simple way memory cells of a phase change type or of some other type, in which all or at least some of the states stored in the memory cells are associated to a cell conduction condition, and it becomes difficult to use fixed references due to retention or the like causing variability of the characteristics in time or for yet other reasons.

Moreover, the proposed solution advantageously enables exploitation of a global bit line adjacent to the one associated to the memory cell to be read, which thus has electrical characteristics, in particular parasitic capacitances, that are similar.

With the solution described, it is not necessary to use reference structures, except for the current source 48; in particular, use of reference memory cells is not envisaged.

Consequently, the memory device 30 has dimensions that are smaller as compared to known solutions, and also the electrical consumption are lower.

The memory device 30 moreover has a higher reading speed.

Finally, it is clear that modifications and variations may be made to the memory device and to the reading method described and illustrated herein, without thereby departing from the scope of the present invention, as defined in the attached claims.

For instance, as mentioned, the present solution may be applied also to other types of non-volatile memory devices (of an embedded or stand-alone type), for example flash, EPROM, or EEPROM devices, either single-level or multilevel, where current comparison for reading the stored datum is desired.

In addition, the source enable signal EN, instead of acting directly on the current source 48, may act on a switch that couples/decouples the current source 48 to/from the internal node 45 without thus modifying the operation described above.

The first equalization transistor 65 may be missing.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A non-volatile memory device, comprising:
   a memory array formed by a plurality of memory cells arranged in rows and columns, wherein at least one first memory cell storing a datum is arranged in a first column and is coupleable to a first bit line;
   a first circuit branch associated to the first bit line and having:
   a first node coupled to the first bit line;
   an output node; and
   switch means configured to selectively couple the first node to the first memory cell and the first bit line to the output node;
   a comparator stage having a first input coupled to the output node, a second input coupled to a reference voltage, and an output supplying an output signal indicative of a datum stored in the first memory cell;
   a current source, controllable to inject a shift current into the first bit line, the shift current having a value higher than a current passing in the first memory cell when the latter is in a first programming state, and lower than the current passing in the first memory cell when the latter is in a second programming state; and
   a control unit configured to control, during reading of the first memory cell, the switch means so that:
   in a precharging step, when the first memory cell is disabled, the first bit line is precharged at a line precharging voltage, and the current source is deactivated and does not supply the shift current;
   in a characteristic shift step, when the first memory cell is enabled and connected to the bit line, the first bit line is decoupled from the output node, and the current source is activated and supplies the shift current to the first bit line, thereby the bit line charges or discharges on the basis of the datum stored; and
   in a detection step, the current source is deactivated, and the switch means connects the first bit line to the output node.

2. The device according to claim 1, wherein the first circuit branch further comprises:
   a second node;
   a first connection switch configured to selectively couple the first node to the second node; and
   a second connection switch configured to selectively couple the second node to the output node,
   wherein, in the precharging step, the first and second nodes are precharged at respective precharging voltages; in the characteristic shift step, the second connection switch decouples the second node from the output node; and, in the detection step, the second connection switch connects the second node to the output node.

3. The device according to claim 2, further comprising a first capacitance coupled to the first node and a second capacitance coupled to the output node;
   wherein the control unit is configured so that, in a sharing step, following the characteristic-shift step and prior to the detection step, the first memory cell is decoupled from the first node, the current source is deactivated, and the second node is coupled to the output node to cause a charge sharing between the first and second capacitances.

4. The device according to claim 2, wherein the memory array comprises a second memory cell storing a datum, the second memory cell being arranged in a second column and being coupleable to a second bit line, different from the first bit line, the device further comprising:
a second circuit branch associated to the second bit line and having a third node coupled to the second bit line; a fourth node; and a reference node, coupled to the second input of the comparator stage; a third connection switch arranged between the third node and the fourth node; a fourth connection switch arranged between the fourth node and the reference node; and
a coupling stage, comprising a first coupling switch, controllable by the control unit to couple the output node and the reference node in an equalization step following the precharging step and before the characteristic shift step, and to decouple the output node and the reference node in the characteristic shift and detection steps.

5. The device according to claim 4 when depending upon claim 3, wherein the coupling stage further comprises a second coupling switch controllable by the control unit to couple the second and fourth nodes of the first and second circuit branches during the equalization step, and to decouple the second and fourth nodes during the characteristic shift and sharing steps.

6. The device according to claim 5, wherein the coupling stage further comprises a third coupling switch, controllable by the control unit, to couple the first and third nodes of the first and second circuit branches during the equalization step, and decouple the first and third nodes during the characteristic shift and sharing steps.

7. The device according to claim 3, wherein the first bit line comprises a first global bit line and a first local bit line; and the first circuit branch further comprises a fifth connection transistor having a first terminal coupled to the first local bit line, a second terminal coupled to the first global bit line, and a control terminal receiving a first local decoding signal from the control unit, wherein the fifth connection transistor is controllable by the control unit so as to couple the first local bit line to the first global bit line in the precharging, equalization, and characteristic shift steps, and decouple the first local bit line from the first global bit line in the sharing step.

8. The device according to claim 7 when depending upon claim 4, wherein the second bit line comprises a second global bit line and a second local bit line; and the second circuit branch further comprises a sixth connection transistor having a first terminal coupled to the second local bit line, a second terminal coupled to the second global bit line, and a control terminal receiving a second local decoding signal from the control unit, wherein the sixth connection transistor is controllable by the control unit so as to keep the second memory cell off during reading of the first memory cell.

9. The device according to claim 8, wherein the first and second global bit lines are adjacent.

10. The device according to claim 1, wherein the memory cells are phase change memory cells.

11. The device according to any of claim 2, wherein the current source is selectively coupled to the second node.

12. A method for reading a memory cell of a non-volatile memory device having a memory array formed by a plurality of memory cells arranged in rows and columns, wherein at least one first memory cell storing a datum is arranged in a first column and is coupleable to a first bit line; a first circuit branch is associated to the first bit line and has a first node coupled to the first bit line, an output node, and a current source controllable to inject a shift current in the first bit line, the shift current having a value higher than a current passing the first memory cell when the first memory cell is in a first programming state, and lower than the current passing the first memory cell when the first memory cell is in a second programming state,
the method comprising:
a precharging step, wherein the first memory cell is disabled, the first bit line is precharged at a line precharging voltage, and the current source is deactivated and does not supply the shift current;
a characteristic shift step, wherein the first memory cell is enabled and connected to the first bit line, the first bit line is decoupled from the output node, and the current source supplies the shift current to the first bit line, and wherein, on the basis of the datum stored, the bit line goes to a shifted voltage, lower or higher than the precharging line voltage; and
a detection step, wherein the shift current is interrupted, the first bit line is connected to the output node, and the translated voltage is compared with a reference voltage.

13. The method according to claim 12, wherein the first circuit branch further comprises a second node interposed between the first node and the output node, wherein:
in the precharging step, the first and second nodes are precharged at respective first voltage values;
in the characteristic shift step, the second node is decoupled from the output node; and
in the detection step, the second node is coupled to the output node.

14. The method according to claim 13, wherein the shift current is a constant current.

15. The method according to claim 13, further comprising a sharing step following the characteristic shift step and before the detection step, wherein the first memory cell is decoupled from the first node, the current source is deactivated, and the first and second nodes are coupled together to generate a charge sharing between a first capacitance coupled to the first node and a second capacitance coupled to the second node.

16. The method according to claim 15, wherein, in the sharing step, the second voltage value on the first node is lower than the first voltage value on the first node, when the datum stored is a logic '1'; and is higher than the first voltage value on the first node, when the datum stored is a logic '0'.

17. The method according to claim 13, wherein the memory array comprises a second memory cell storing a datum, arranged in a second column and coupleable to a second bit line, different from the first bit line, and the device further comprises a second circuit branch associated to the second bit line and having a third node coupled to the second bit line; a fourth node selectively coupleable to the third node; and a reference node selectively coupleable to the fourth node and coupled to the second input of the comparator stage to supply the reference voltage;
the method further comprising:
an equalization step following the precharging step and before the characteristic shift step, wherein the output node and the reference node are coupled together and brought to a same voltage value,
wherein, in the characteristic shift step, the output node and the reference node are decoupled from each other; and during the detection step, voltages at the output node and on the reference node are compared.

18. The method according to claim 17, wherein, in the equalization step, the first node and the third node are coupled together and brought to a same voltage, and the second node and the fourth node are coupled together and brought to a same voltage.

19. A non-volatile memory device, comprising:
a memory array formed by a plurality of memory cells arranged in rows and columns, wherein at least one first memory cell storing a datum is arranged in a first column and is coupleable to a first bit line;
a first circuit branch associated to the first bit line and having:
a first node coupled to the first bit line;
an output node; and
a switch configured to selectively couple the first node to the first memory cell and the first bit line to the output node;
a comparator stage having a first input coupled to the output node, a second input coupled to a reference voltage, and an output supplying an output signal indicative of a datum stored in the first memory cell;
a current source, controllable to inject a shift current into the first bit line, the shift current having a value higher than a current passing in the first memory cell when the latter is in a first programming state, and lower than the current passing in the first memory cell when the latter is in a second programming state; and
a control unit configured to control the switch.

20. The non-volatile memory device, wherein the control unit is configured to provide a precharging mode of operation, a characteristic shift mode of operation, and a detection mode of operation.

* * * * *